United States Patent [19]
Kanamori

[11] Patent Number: 6,124,716
[45] Date of Patent: Sep. 26, 2000

[54] CIRCUIT CONTINUITY TEST APPARATUS

[75] Inventor: Hiroyasu Kanamori, Shizuoka, Japan

[73] Assignee: Yazaki Corporation, Tokyo, Japan

[21] Appl. No.: 08/743,311

[22] Filed: Nov. 5, 1996

[51] Int. Cl.[7] .................................................. G01R 27/26
[52] U.S. Cl. .......................... 324/538; 439/76.1; 361/737
[58] Field of Search ..................................... 324/503, 555, 324/538; 361/737, 759; 439/338, 76.1, 912.1

[56] References Cited

U.S. PATENT DOCUMENTS

| | | | |
|---|---|---|---|
| 4,545,633 | 10/1985 | McGeary | 339/42 |
| 4,909,745 | 3/1990 | Hayashi | 439/76 |
| 4,924,179 | 5/1990 | Sherman | 324/755 |
| 5,154,647 | 10/1992 | Ishitani et al. | 439/933 |
| 5,184,282 | 2/1993 | Kaneda | 361/737 |
| 5,264,796 | 11/1993 | Klassen et al. | 324/503 |
| 5,457,392 | 10/1995 | Filipescu | 324/555 |
| 5,466,162 | 11/1995 | Schroepfer et al. | 439/79 |

FOREIGN PATENT DOCUMENTS 4130978  9/1991  Germany .

*Primary Examiner*—Maura Regan
*Attorney, Agent, or Firm*—Young & Basile, P.C.

[57] ABSTRACT

An electrical junction block as used in an automobile electrical system has a pair of ports for removably receiving two separate connectors into connection with circuit traces of a printed circuit board contained within the junction block. The first port is configured to receive a wiring harness connector associated with one or more electrical devices into normal operating connection with the junction block. The second port is configured to removably receive a connector from a continuity tester such that terminals of the connector contact the circuit traces so as to be in electrical contact with the wiring harness connector. Accordingly, inserting the tester connector into the second port after the wiring harness connector is operatively installed in the first port puts the tester in connection with the electrical system via the circuit traces and allows the tester to perform a continuity check of the device without disconnecting the wiring harness connector. Further, the tester is able to check the connection between the wiring harness connector and the junction block.

5 Claims, 2 Drawing Sheets

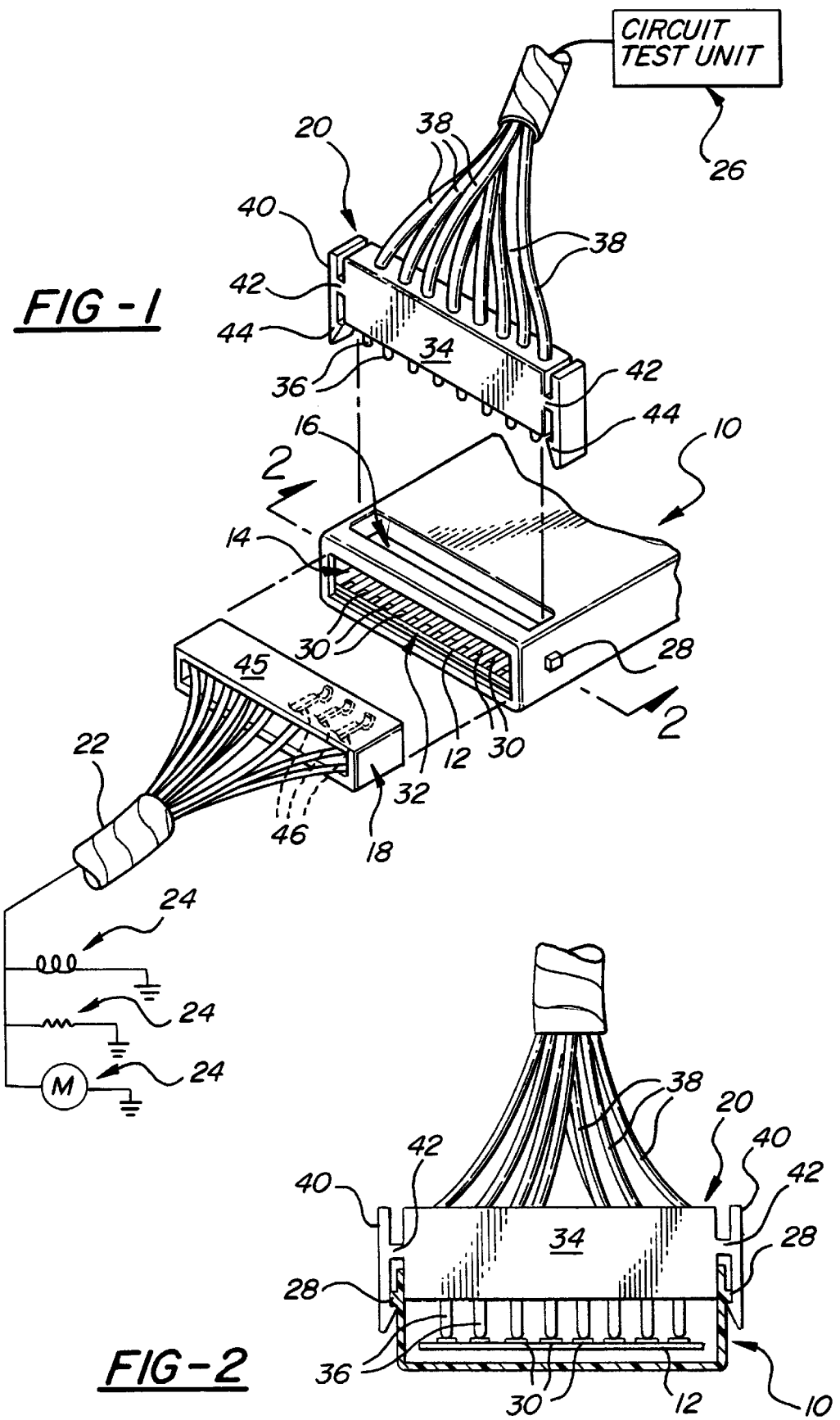

6,124,716

CIRCUIT CONTINUITY TEST APPARATUS

FIELD OF THE INVENTION

The present invention relates to electrical continuity testing equipment and procedures, and more specifically to apparatus for and a method of checking the continuity of electrical devices connected to a junction block by wiring harnesses.

BACKGROUND OF THE INVENTION

Automotive vehicles include numerous electrically powered devices, many of which are connected to related devices and to a vehicle power circuit by means of wiring harnesses. A wiring harness typically terminates in a multi-pin electrical connector which plugs into a junction block. The junction block commonly comprises a molded plastic case containing a printed circuit board (PCB), and one or more wiring harness connectors make contact with circuit traces on the PCB by means of conventionally known edge connectors and/or surface connectors.

The various electrical devices of an automotive vehicle are often subjected to quality control testing during the manufacture of the vehicle. This typically involves connecting the wiring harness leading to one or more devices to an electrical continuity tester, a device which applies electrical current to the devices via the wiring harness and checks the circuits of the devices for proper voltage drops and other circuit parameters. Similar electrical continuity testing is sometimes also necessary during routine maintenance and/ or trouble-shooting of vehicle system malfunctions after the vehicle has left the factory.

Electrical continuity testing traditionally has required that any wiring harness already operatively connected with the junction block be disconnected therefrom so that it may be re-connected to the tester. After the continuity test procedure is complete, the wiring harness connector must be disconnected from the tester and reconnected to the junction block. A drawback of this procedure is that it requires multiple disconnections and re-connections of the wiring harness connector undergoing the test. This is a time consuming and labor-intensive process that adds to the cost of the test procedure. Another drawback to the above-described test procedure is that it raises the possibility that the wiring harness connector will be improperly re-connected to the junction block at the end of the test. In such a case of improper re-connection, a positive result on the just-completed continuity test may be negated, and there will be no indication of the poor connection until the subject devices begin to malfunction during use.

SUMMARY OF THE INVENTION

In view of the above-stated deficiencies in the existing circuit continuity test procedures, it is an objective of the present invention to reduce the time and cost of performing circuit continuity checks on electrical devices and to improve the reliability of the test. In general, this is achieved by providing a method and apparatus for testing circuit continuity of an electrical device connected to a junction block without requiring that the device be removed from its operative connection with the junction block and re-connected to a circuit test unit.

According to the present invention, a junction block is provided which has a pair of adjacent ports for removably receiving two separate connectors into electrical contact with circuit means contained within the junction block. The first port is configured to receive a connector attached to a wiring harness associated with one or more electrical devices. Insertion of the wiring harness connector into the port places the associated devices in normal operating connection with the junction block wherein the circuit means provides electrical power and other connections necessary for functioning of the devices. The second port is configured to removably receive a connector from a continuity tester such that terminals of the connector contact the circuit means so as to be in electrical contact with the wiring harness connector. Accordingly, inserting the test unit connector into the second port while the wiring harness connector is operatively installed in the first port places the tester in connection with the electrical system via the circuit means, and so allows the tester to perform a continuity check of the device without disconnecting the wiring harness connector. Further, the tester is able to check the connection between the wiring harness connector and the junction block.

In the preferred embodiment of the invention disclosed herein, the circuit means comprises a printed circuit board having a group of circuit traces on an upper side thereof. The circuit traces are configured to provide an edge connection adjacent the first port and a surface connection adjacent the second port. The wiring harness connector is operatively connected to the edge connector and remains connected while the testing unit connector is inserted through the second port to contact the surface connection. This configuration of the two ports results in a very space-efficient use of available junction box surface area so that room is available for the test unit connections even on a junction box having many wiring harnesses connected thereto.

According to a further feature of the invention, the tester connector and the junction block have complementary latching means for securing the tester connector and the junction block in secure engagement with one another.

According to another feature of the present invention, the tester connector is fitted with a retractable sleeve which substantially surrounds the terminal pins of the connector when the connector is not attached to the junction block. As the connector is urged into the second port, the sleeve slides back from its protective position around the pins so that they may project into with the circuit means.

According to yet another feature of the present invention, the junction block has a movable cover which substantially blocks the second port when the tester connector is not received therein. The cover is displacable from the blocking position by contact with the tester connector to permit the connector to pass through the second port.

BRIEF DESCRIPTION OF THE DRAWINGS

FIG. 1 is an exploded perspective view of a junction block and test unit connector according to the present invention in combination with a wiring harness and connector;

FIG. 2 is a cross-section taken along line 2—2 of FIG. 1, showing the test unit connector inserted in the junction block;

DETAILED DESCRIPTION OF THE PREFERRED EMBODIMENT

Figure 3:
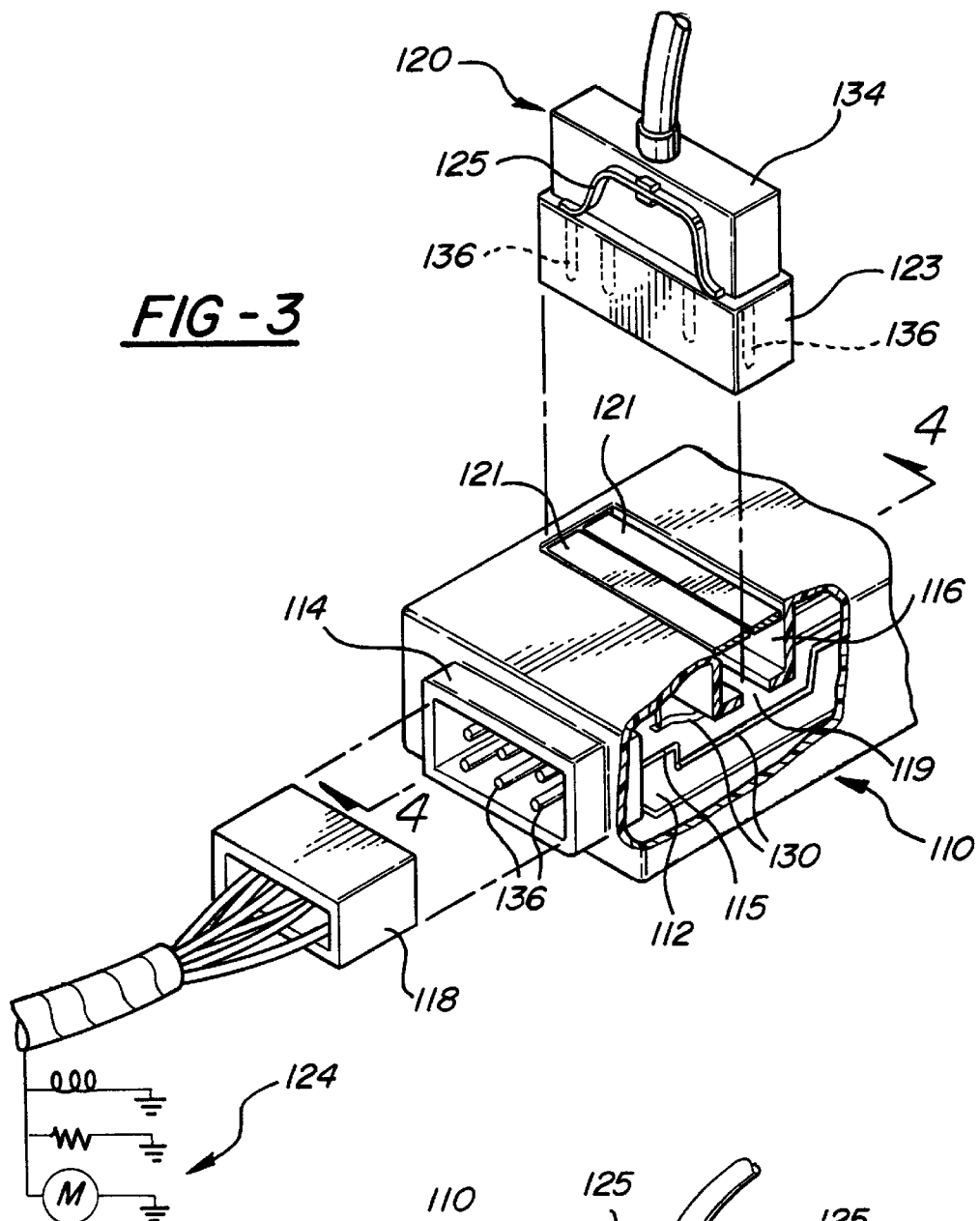
FIG. 3 is an exploded perspective view of a junction block and test unit connector according to a second embodiment of the invention.

FIG. 1 depicts an electrical junction block 10 having an internally mounted printed circuit board (PCB) 12 and a pair of ports 14, 16 adapted to receive a wiring harness connector 18 and a test unit connector 20 respectively into connection with the PCB 12. Wiring harness connector 18 terminates a wiring harness 22 leading to one or more electrical devices 24 shown in schematic form. Test unit connector 20 is connected to a circuit test unit 26 of the type conventionally used to check electrical continuity and other parameters of a circuit.

Junction block 10 is depicted as being of a type commonly used in automotive vehicles to distribute electrical power and/or otherwise operatively interconnect various devices of the vehicle electrical system. Such an automotive junction block will often have numerous connector ports for receiving a multitude of wiring harness connectors associated with different groups of electrical devices, but for clarity only a portion of junction block 10 is shown.

Connector port 14 takes the form of an elongated opening in the end surface of junction block 10. Test port 16 is located on the upper surface of junction block 10 immediately adjacent connector port 14 and extends parallel to the connector port. Latching nubs 28 project outwardly from the lateral surfaces of the junction block 10 just below either end of test port 16.

PCB 12 has circuit traces 30 formed on an upper surface thereof by deposition of a conductive material such as copper. The portion of PCB 12 adjacent connector port 14 comprises a conventionally known edge connector 32 wherein a group of circuit traces 30 terminate adjacent the edge of PCB 12. The group of circuit traces 30 forming edge connector 32 extend inwardly from the edge of PCB 12 and pass directly beneath test port 16.

Test unit connector 20 comprises a body 34 from which a plurality of terminal pins 36 extend, the pins being electrically connected to wires 38 extending to test unit 26. A latching plate 40 is located at either end of body 34 and is connected thereto by an integrally molded elastic link 42. Latching plates 40 have latching pawls 44 projecting inwardly therefrom adjacent their lower ends.

Wiring harness connector 18 is of conventional design, comprising a substantially hollow body 45 which houses a plurality of terminals 46 adapted to make contact with the circuit traces 30 of edge connector 32 when the connector is inserted into connector port 14. Wiring harness connector 18 and junction block 10 may be provided with interlocking means for latching the connector into the inserted position, as is well known in the art.

During assembly of the vehicle, wiring harness connector 18 is inserted into connector port 14 to place electrical devices 24 in operative connection with the circuitry within junction block 10. In this condition, devices 24 may be supplied with power and/or connected to other electrical components as required for normal functioning of the vehicle systems.

When it is desired to test the circuits of electrical devices 24, either as a quality control check during vehicle manufacture or later as part of a trouble-shooting or routine maintenance operation, test unit connector 20 is inserted into test port 16 such that terminal pins 36 electrically contact the same circuit traces 30 to which wiring harness connector terminals 46 are connected. As test unit connector 20 is inserted into test port 16, latching plates 40 pass down over the vertical surfaces of the junction block 10 and pawls 44 come into contact with respective latching nubs 28 projecting outwardly from the surfaces. Elastic links 42 allow latching plates 40 to deflect outward slightly at their lower ends so that pawls 44 ride over latching nubs 28 as test unit connector 20 continues moving downward into test port 16. Latching nubs 28 are positioned such that when test unit connector 20 reaches full insertion, as defined by terminal pins 36 being in contact with the surfaces of circuit traces 30, the latching plates 40 return to their undeflected positions wherein latching pawls 44 are hooked over latching nubs 28, as shown in FIG. 2. This engagement between latching nubs 28 and latching pawls 44 secures test unit connector 20 in engagement with junction block 10 in order to prevent inadvertent disconnection during the testing procedure.

Insertion of test unit connector 20 into junction block 10 places circuit test unit 26 in electrical connection with devices 24 via wiring harness connector 18 and wiring harness 22 such that the test unit 26 may supply current to the devices 24 and check electrical continuity and other circuit parameters. Wiring harness connector 18 maintains its normal operative connection with junction block 10 throughout the test procedure.

When the test procedure is terminated, test unit connector 20 is disconnected from test port 16 by squeezing inwardly on the upper ends of latching plates 40 to release latching pawls 44 from latching nubs 28, and pulling the test unit connector 20 upward. At no time during the test procedure is the operational connection between junction block 10 and wiring harness connector 18 disturbed.

Figure 4:
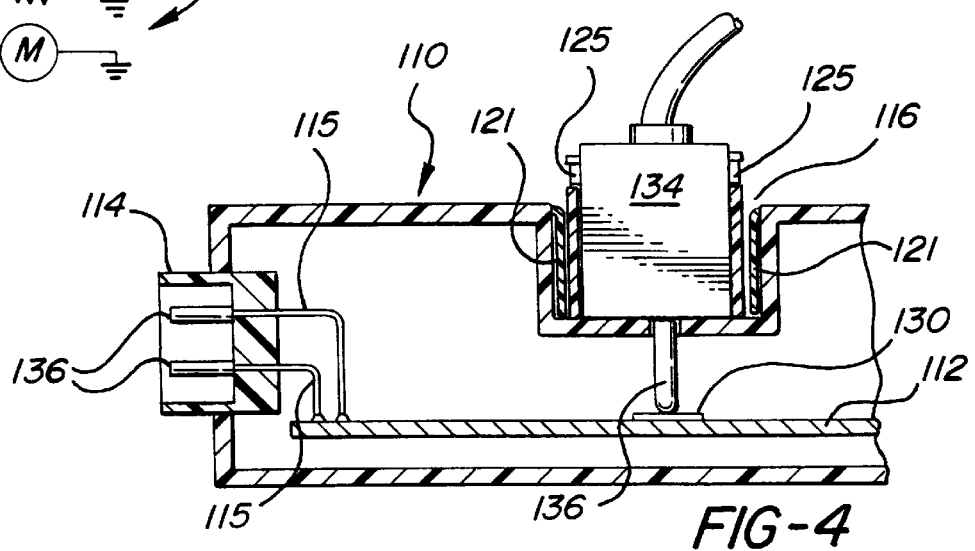
FIG. 4 is a cross-section taken along line 4—4 of FIG. 3, showing the test unit connector inserted in the junction block.

An alternative embodiment of the present invention is shown in FIGS. 3 and 4. In the FIG. 3 embodiment, a junction block 110 houses a PCB 112 and has a connector port in the form of a multi-pin connector 114 projecting through the end surface of the block. Multi-pin connector 114 is conventional in construction, having a plurality of terminal pins 136 housed therein. Leads 115 extend from terminal pins 136 into the interior of the junction block 110 and are soldered to circuit traces 130 on the PCB 112. A test port comprises a rectangular recess 116 molded integrally with and extending into the junction block 110 from its upper surface. An elongated slot 119 is formed in the bottom surface of recess 116 to communicate with the interior of the junction block 110. A pair of covers 121 are attached to junction block 110 adjacent opposite edges of recess 116 and extend inwardly therefrom to meet one another and substantially close off the upper opening of the recess 116. In the preferred embodiment, covers 121 are formed of a thin, flexible material having sufficient stiffness to maintain the planar configuration as shown in FIG. 3. Alternatively, covers 121 may be rigid members attached to junction block 110 by hinges and spring biased to the planar configuration.

Test unit connector 120 comprises a body 134 having a single row of terminal pins 136 extending therefrom and a sleeve 123 which encircles the body and is slidingly attached thereto. Sleeve 123 is biased by springs 125 or equivalent means to an extended position wherein, as shown in FIG. 3, it projects downwardly from the body 134 so that its lower edge is substantially even with the distal ends of terminal pins 136. Sleeve 123 is slidable upward, against the biasing force, to a retracted position wherein it surrounds body 134 but leaves terminal pins 136 exposed.

A wiring harness connector 118 of conventional design mates with multi-pin connector 114 to operatively connect electrical devices (not shown) with junction block 110 in a manner similar to that of the first embodiment described hereinabove.

To execute a continuity check of the electrical devices 124 and the connection between wiring harness connector 118 and multi-pin connector 114, test unit connector 120 is inserted into recess 116 such that terminal pins 136 contact the same circuit traces 130 to which connector leads 115 are soldered. Before insertion of test unit connector 120, covers 121 substantially block the upper opening of recess 116 to inhibit the intrusion of dirt, water, or other contaminants into the recess. Sleeve 123 is initially in its extended position wherein it protects terminal pins 136 against possibly damaging contact with other objects. Urging of test unit connector 120 into recess 116 causes covers 121 to bend downwardly, as shown in FIG. 4, and so permit passage of the connector. When test unit connector 120 has been inserted to the point where sleeve 123 is completely within recess 116 and contacting the bottom surface thereof, terminal pins 136 are aligned with slot 119. Continued downward urging of test unit connector 120 causes the sleeve 123 to slide to the retracted position as terminal pins 136 project downwardly through slot 119 and into contact with circuit traces 130. If necessary, latching means may be provided to maintain test unit connector 120 in the inserted position with respect to junction block 110.

It will be appreciated that the drawings and descriptions contained herein are merely meant to illustrate particular embodiments of the present invention and are not meant to be limitations upon the practice thereof, as numerous variations will occur to persons of skill in the art. For example, although the invention is described above in relation to an automotive vehicle electrical system, it is to be understood that the invention may also be practiced in relation to any electrical system wherein one or more devices are connected to a junction block or similar component and it is desirable to test electrical continuity of the circuits involved.

The invention claimed is:

1. An electrical testing assembly comprising:

a first connector for electrical connection with an electrical device, the first connector having a plurality of terminals;

a second connector for electrical connection with a test unit, the second connector having a plurality of terminals; and an electrical junction block containing a printed circuit board having a plurality of circuit traces disposed on a surface thereof, a group of the circuit traces extending to an edge of the printed circuit board to form an edge connection;

a first port formed on the junction block for removably receiving the first connector from a first direction substantially parallel to the printed circuit board into electrical connection with the edge connection; and a second port formed on the junction block adjacent the group of circuit traces for removably receiving the second connector from a second direction substantially perpendicular to the printed circuit board, insertion of the second connector into the second port placing the terminals of the second connector in direct contact with surfaces of the group of circuit traces.

2. An electrical testing assembly according to claim 1 wherein the second connector and the junction block have complementary latching means for securing the second connector and the junction block in engagement with one another.

3. An electrical testing assembly according to claim 1 wherein the second connector comprises:

a housing;

a plurality of pins extending from the housing for making contact with the group of circuit traces; and a sleeve slidably attached to the housing, the sleeve biased to an extended position wherein the sleeve substantially surrounds the pins and movable to a retracted position wherein the pins project beyond the sleeve, the sleeve movable from the extended position to the retracted position by contact with the junction block as the pins are inserted through the second port to contact the group of circuit traces.

4. An electrical testing assembly according to claim 1 wherein the junction block further comprises a cover movably mounted on the junction block for substantially blocking the second port when the second connector is not received therein, the cover displaceable from the blocking position by contact with the second connector to permit the second connector to pass through the second port.

5. An electrical junction block comprising:

a housing having a plurality of connector ports for receiving respective electrical connectors therethrough;

a printed circuit board retained within the housing and having a plurality of circuit traces disposed on a surface thereof, a group of the circuit traces extending to an edge of the printed circuit board adjacent a first of the connector ports, whereby a first of the electrical connectors is insertable into the first connector port in a direction substantially parallel to the printed circuit board to make contact with the circuit traces at the edge of the board; and a testing port formed in the housing adjacent the group of circuit traces for receiving a test connector from a second direction substantially perpendicular to the surface of the printed circuit board, whereby insertion of the test connector into the testing port places terminals of the test connector in direct contact with respective surfaces of the group of circuit traces.

* * * * *